United States Patent
Nowell et al.

(10) Patent No.: US 11,847,317 B2
(45) Date of Patent: *Dec. 19, 2023

(54) MANAGING BIN PLACEMENT FOR BLOCK FAMILIES OF A MEMORY DEVICE BASED ON TRIGGER METRIC VALVES

(71) Applicant: Micron Technology, Inc., Boise, ID (US)

(72) Inventors: Shane Nowell, Boise, ID (US); Mustafa N Kaynak, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/850,956

(22) Filed: Jun. 27, 2022

(65) Prior Publication Data

US 2022/0326851 A1    Oct. 13, 2022

Related U.S. Application Data

(63) Continuation of application No. 17/084,549, filed on Oct. 29, 2020, now Pat. No. 11,372,545.

(51) Int. Cl.
| | |
|---|---|
| *G11C 16/04* | (2006.01) |
| *G06F 3/06* | (2006.01) |
| *G11C 16/26* | (2006.01) |

(52) U.S. Cl.
CPC .......... *G06F 3/0604* (2013.01); *G06F 3/0659* (2013.01); *G06F 3/0679* (2013.01); *G11C 16/26* (2013.01); *G11C 16/0483* (2013.01)

(58) Field of Classification Search
CPC ............................ G11C 16/26; G11C 16/0483
See application file for complete search history.

(56) References Cited

U.S. PATENT DOCUMENTS

| | | | |
|---|---|---|---|
| 11,023,172 B2 * | 6/2021 | Chen ..................... | G06F 16/245 |
| 11,211,128 B1 | 12/2021 | Sheperek et al. | |
| 11,222,704 B1 * | 1/2022 | Rayaprolu ......... | G11C 16/3404 |
| 11,282,564 B1 * | 3/2022 | Rayaprolu ............ | G11C 11/409 |
| 11,372,545 B2 * | 6/2022 | Nowell ................ | G06F 3/0659 |

* cited by examiner

*Primary Examiner* — Pho M Luu
(74) *Attorney, Agent, or Firm* — Lowenstein Sandler LLP

(57) ABSTRACT

A processing device of a memory sub-system is configured to select, during a first period of time of a plurality of predetermined periods of time, a first voltage bin of a plurality of voltage bins associated with a memory device; perform, during a second period of time, a read operation of a block of the memory device, using a first set of read level offsets associated with the first voltage bin; determine a trigger metric associated with the first set of read level offsets; and responsive to determining that the trigger metric satisfies a predefined condition, performing a second read operation, during a third period of time, using the first set of read level offsets associated with the first voltage bin.

18 Claims, 12 Drawing Sheets

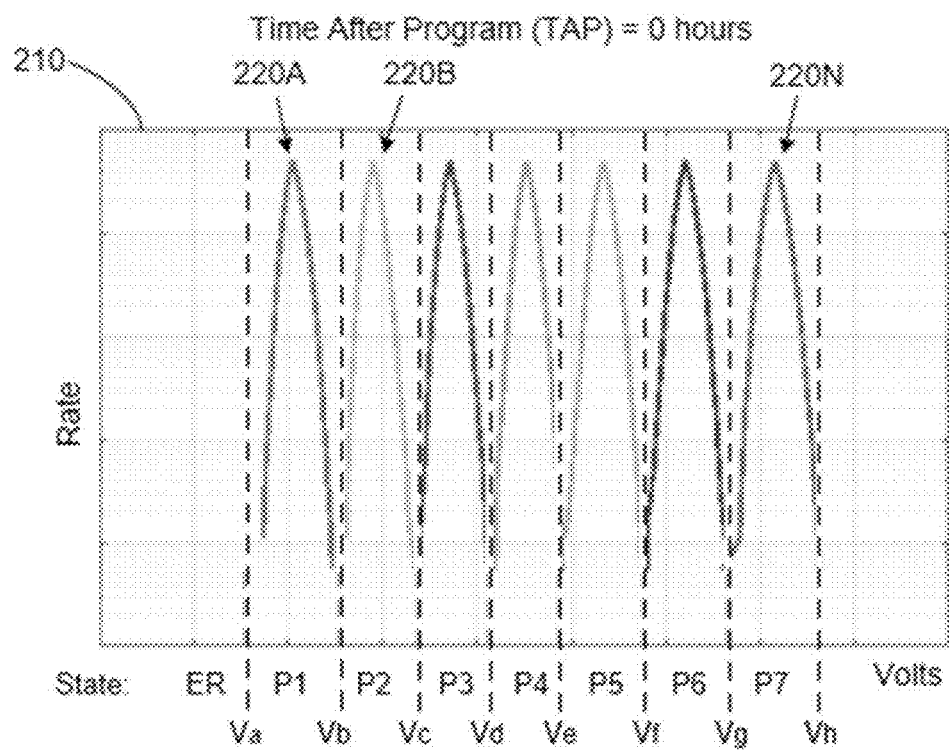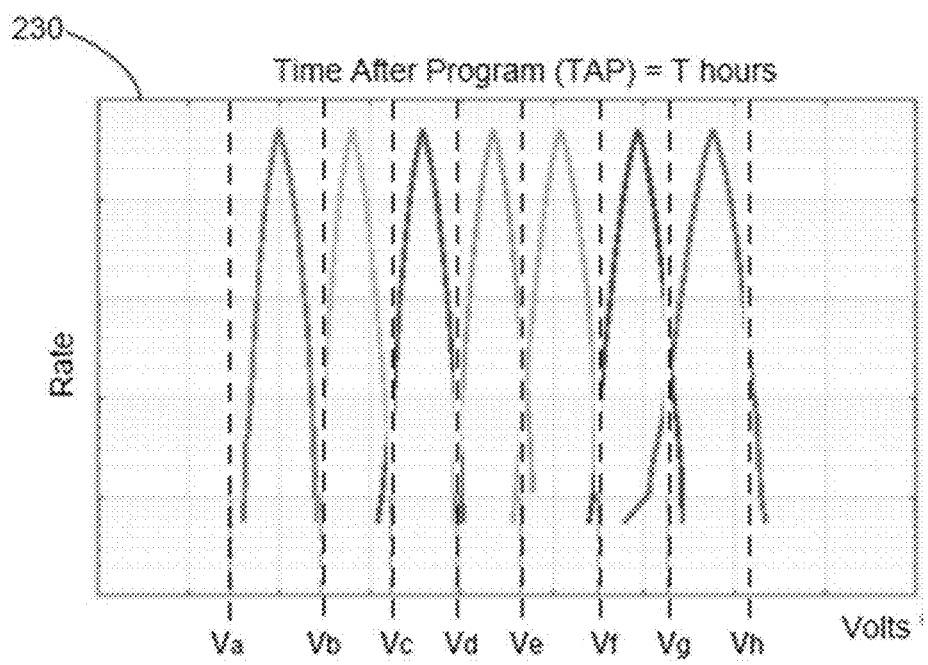
FIG. 2

SuperBlock Table 710

| SuperBlock | Partition | Time Hr | Temp | Family |
|---|---|---|---|---|
| 0 | 0 | 10 | 31 | 4 |
| 0 | 1 | 11 | 35 | 5 |
| 0 | 2 | 11 | 50 | 20 |
| ... | ... | ... | ... | ... |
| 1 | 0 | | | 20 |
| 1 | 1 | | | 21 |
| 1 | 2 | | | 0 |
| 1 | 3 | | | 0 |
| ... | ... | | | 0 |
| 1 | 30 | | | 1 |
| 1 | 31 | | | 1 |
| ... | ... | | | 1 |
| ... | ... | | | ... |
| 745 | 29 | | | 22 |
| 745 | 30 | | | 0 |
| 745 | 31 | | | 0 |

Family Table 720

| Index | Die 0 bin | Die 1 bin | ... | Die N bin |
|---|---|---|---|---|
| 1 | 5 | 6 | | 4 |
| 2 | 4 | 2 | | 5 |
| 3 | | | | |
| 4 | 3 | | | |
| 5 | | | | |
| ... | | | | |
| 20 | | | | |
| 21 | | | | |
| 22 | | | | |
| ... | | | | |
| 62 | | | | |
| 63 | | | | |
| 64 | | | | |

Offset table 730

| Bin | TLC 1 | TLC 2 | TLC 3 | TLC 4 | TLC 5 | TLC 6 | TLC 7 | MLC 1 | MLC 2 | MLC 3 | SLC |
|---|---|---|---|---|---|---|---|---|---|---|---|
| 1 | 0 | 1 | 1 | 1 | -1 | -2 | -4 | 4 | 0 | 2 | 2 |
| 2 | | | | | | | | | | | |
| 3 | | | | | | | | | | | |
| ... | | | | | | | | | | | |
| 64 | | | | | | | | | | | |

┌─────────────────────────────────────────────────────────────────────┐
│ SELECT, DURING A FIRST PERIOD OF TIME OF A PLURALITY OF PREDETERMINED│
│ PERIODS OF TIME, A FIRST VOLTAGE BIN OF A PLURALITY OF VOLTAGE BINS  │
│ ASSOCIATED WITH A MEMORY DEVICE, WHEREIN EACH VOLTAGE BIN OF THE    │
│ PLURALITY OF VOLTAGE OFFSET BINS IS ASSOCIATED WITH A CORRESPONDING │
│                       SET OF READ LEVEL OFFSETS                      │
│                                 1010                                 │
└─────────────────────────────────────────────────────────────────────┘
                                   │
                                   ▼
┌─────────────────────────────────────────────────────────────────────┐
│ PERFORM, DURING A SECOND PERIOD OF TIME, A READ OPERATION OF A BLOCK│
│  OF THE MEMORY DEVICE USING A FIRST SET OF READ LEVEL OFFSETS OF THE│
│                          FIRST VOLTAGE BIN                           │
│                                 1020                                 │
└─────────────────────────────────────────────────────────────────────┘
                                   │
                                   ▼
┌─────────────────────────────────────────────────────────────────────┐
│  DETERMINE, BASED ON THE READ OPERATION, A TRIGGER METRIC ASSOCIATED│
│    WITH THE FIRST SET OF READ LEVEL OFFSETS OF THE FIRST VOLTAGE BIN │
│                                 1040                                 │
└─────────────────────────────────────────────────────────────────────┘
                                   │
                                   ▼
┌─────────────────────────────────────────────────────────────────────┐
│ RESPONSIVE TO DETERMINING THAT THE TRIGGER METRIC FAILS TO SATISFY A│
│  PREDEFINED CONDITION, SELECT A SECOND VOLTAGE BIN, WHEREIN A SECOND│
│   SET OF READ LEVEL OFFSETS OF THE SECOND VOLTAGE BIN IS ASSOCIATED │
│   WITH A SECOND TRIGGER METRIC THAT SATISFIES THE PREDEFINED CONDITION│
│                                 1050                                 │
└─────────────────────────────────────────────────────────────────────┘
```

FIG. 10

… # MANAGING BIN PLACEMENT FOR BLOCK FAMILIES OF A MEMORY DEVICE BASED ON TRIGGER METRIC VALVES

RELATED APPLICATIONS

This application is a continuation application of U.S. patent application Ser. No. 17/084,549, filed Oct. 29, 2020, now U.S. Pat. No. 11,372,545, which is incorporated herein by reference.

TECHNICAL FIELD

Embodiments of the disclosure are generally related to memory sub-systems, and more specifically, are related to managing bin placement for block families of a memory device, based on trigger metric values.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 2 schematically illustrates the temporal voltage shift caused by the slow charge loss exhibited by triple-level memory cells, in accordance with some embodiments of the present disclosure.

FIG. 7 schematically illustrates example metadata maintained by the memory sub-system controller for associating blocks and/or partitions with block families, in accordance with embodiments of the present disclosure.

FIG. 10 is a flow diagram of an example method of managing bin placement for block families of a memory device based on trigger metric values associated with placed bins, in accordance with some embodiments of the present disclosure.

DETAILED DESCRIPTION

Figure 1:
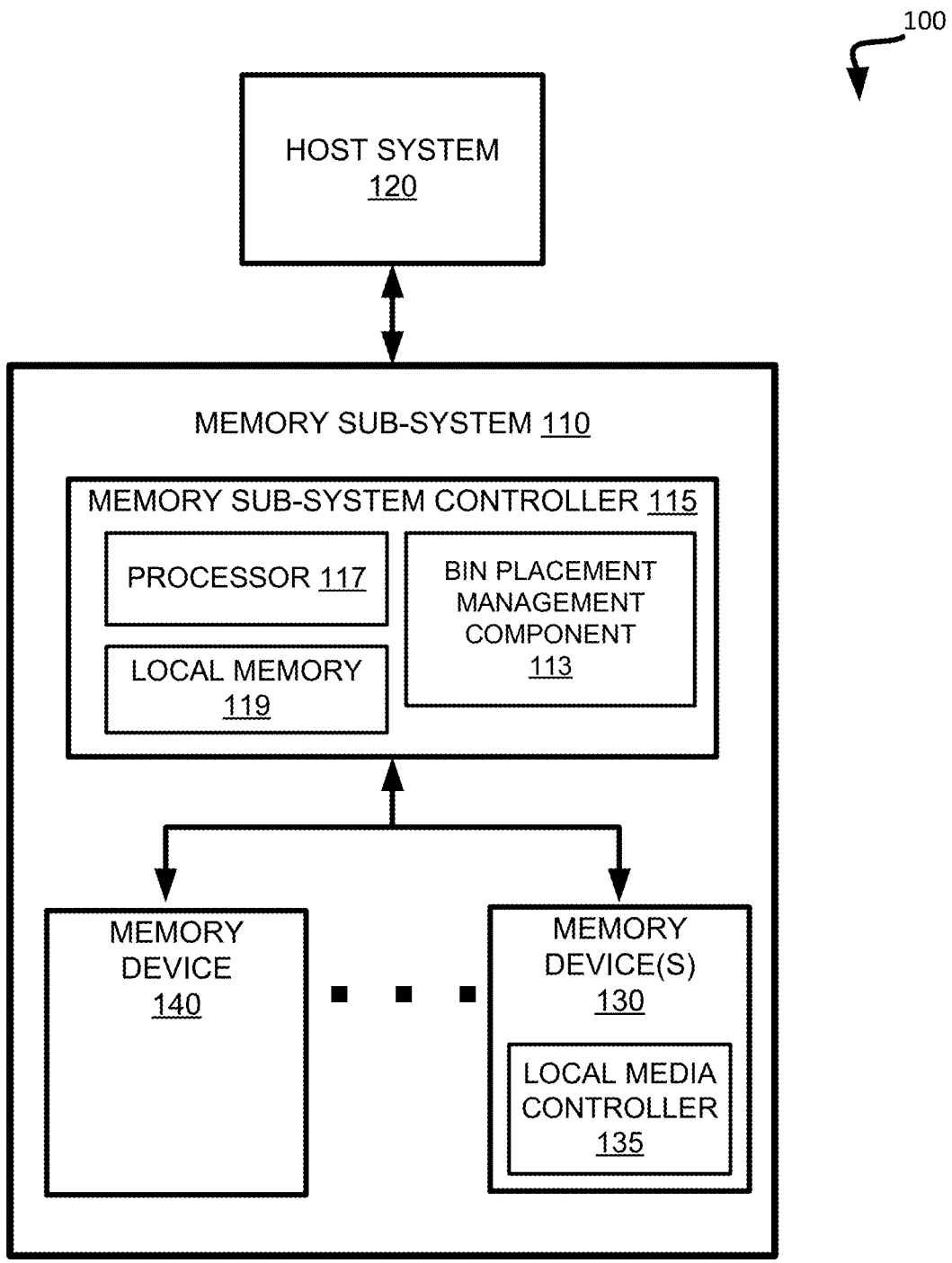
FIG. 1 illustrates an example computing system that includes a memory sub-system in accordance with some embodiments of the present disclosure.

Embodiments of the present disclosure are directed to managing bin placement for block families of a memory device. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. A "block" herein shall refer to a set of contiguous or non-contiguous memory pages. An example of "block" is "erasable block," which is the minimal erasable unit of memory, while "page" is a minimal writable unit of memory. Each page includes of a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows the establishment of multiple threshold voltage levels corresponding to different logical levels, thus effectively allowing a single memory cell to store multiple bits of information: a memory cell operated with $2^n$ different threshold voltage levels is capable of storing n bits of information. "Read threshold voltage" herein shall refer to the voltage level that defines a boundary between two neighboring voltage distributions corresponding to two logical levels. Thus, the read operation can be performed by comparing the measured voltage exhibited by the memory cell to one or more reference read voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage changes rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system. In accordance with embodiments of the present disclosure, the temporal voltage shift is selectively tracked for programmed blocks grouped by block families, and appropriate voltage offsets, which are based on block affiliation with a certain block family, are applied to the base read levels in order to perform read operations. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics for slow charge loss (SCL). A block family may be made with any granularity, containing only whole codewords, whole pages, whole super pages, or whole superblocks, or any combination of these. Given that wear-leveling can keep program/erase cycles similar on all blocks, the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to read threshold voltage level per valley exhibited by the memory cell immediately after programming or after a pre-determined time from programming the memory cell. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process in order to associate each die of every block family with one of the predefined threshold voltage bins, which is in turn associated with the voltage offset to be applied for read operations. In some implementations, each voltage bin can have one offset per valley, i.e., between data states. For example, for triple level cells (TLC) blocks storing 3 bits, there can be 8 data states (i.e., levels) and 7 valleys. Hence each voltage bin for TLC blocks can have 7 offsets one for each valley. Reads are associated with pages and each page type corresponds to certain valleys. For the page reads, appropriate offsets are read from the bin the block/block family has been assigned to. The valley(s) corresponding to each page type can be determined by the Gray code used to represent the levels. Gray code refers to a binary numeral system were two successive valleys differ in only one bit (e.g., binary digit). The associations of blocks with block families and block families and dies with threshold voltage bins can be stored in respective metadata tables maintained by the memory sub-system controller.

More specifically, the present disclosure addresses the ability to generate a set of placed bins for the memory device, based on trigger metric values of the placed bins. Placing voltage bins based on a trigger metric associated with each bin at a given time/temperature provides the advantage of efficiently and automatically placing bins within time while maintaining minimum bin spacing between adjacent bins. Trigger metric refers to a measurement indicating the extent to which a memory device can enter error recovery due to non-correctable cells of the memory device. In one implementation, trigger metric can be a trigger rate representing the percentage of codewords with high error rates of the memory device that are not correctable when read outside of an error handling process. The high error rates can be due to using wrong offsets bins due to assigning the block to a wrong bin or the offsets within a bin being sub-optimal In accordance with embodiments of the present disclosure, a set of initial voltage bins can be generated, from which a subset of placed bins can be selected for bin placement within the memory sub-system. Each bin of the initial voltage bins can be associated with read level offsets that can be used for read operations of blocks associated with the bin. While each bin can be associated with multiple read level offsets, a representative page type with associated read level offsets can be used for the purpose of determining a trigger metric based on the read operation. In an embodiment, the initial set of voltage bins can be generated such the read level offsets of the bins for each valley are equally spaced within the voltage distribution of threshold voltages. Read operations of a block of memory can be performed at predetermined periods of time to select a subset of the initial voltage bins that exhibit improved trigger metric values at the predetermined periods of time. As an example, a bin can be selected for placement if the read level offsets of the bin, when used for a read operation of a block, can result in a trigger metric that does not exceed a predetermined trigger metric threshold. The selected subset of voltage bins can then be designated as the placed voltage bins and can be associated with the memory device. Subsequently, block families of the memory device can be assigned to the placed voltage bins of the memory device, based on the time after program (TAP) of each block family.

In certain embodiments, after selecting the set of placed bins, if the number of placed bins exceeds a target number of placed bins for the memory device, the trigger metric threshold of the memory device can be modified and the bin placement process described above can be repeated based on the modified trigger metric threshold, in order to generate more or less number of placed bins, as described in details herein.

In one implementation, the bin placement process disclosed herein can be performed during the manufacturing process of the memory device. It can be performed on a single device or on a sample of a certain type of memory devices, and then provisioned to every memory device of the certain type. In another embodiment, the bin placement process can be performed in the field based on a predetermined frequency or a predetermined age of the memory device.

Therefore, advantages of the systems and methods implemented in accordance with some embodiments of the present disclosure include, but are not limited to, optimizing the bin placement process within time, such that each placed bin is associated with a period of time where read operations performed during that time using the read level offset of the bin can result in successful results with minimal error handling or repeated reads. Because the bin placement process also maintains a minimum spacing between adjacent bins, the overhead of moving block families from one bin to the next over time is minimized. Additionally, the present disclosure provides an automatic process for placing bins without requiring human effort for manual placement.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a bin placement management component 113, which can be used to implement techniques for placing voltage bins based on optimal trigger metric values within memory sub-system 110, in accordance with embodiments of the present disclosure. In some embodiments, bin placement management component 113 can generate a set of initial voltage bins from which a subset of bins can be selected for bin placement within memory sub-system 110. Each bin of the initial voltage bins can be associated with read level offsets that can be used for read operations of blocks associated with the bin corresponding to a particular SCL region. In an implementation, the initial set of voltage bins can be generated such that the read level offsets for a given valley are equally spaced within bins (e.g., the read level offset of a given valley in the initial voltage bins is 2 DACs apart from the read level offset of an adjacent bin for the same valley). For different read level offsets, the DAC increment can be different given that the SCL slope for each valley is different. For example, higher levels experience more SCL compared to lower levels.

After generating the initial voltage bins, bin placement management component 113 can perform read operations of a block of memory at predetermined periods of time (e.g., time slices) to select a subset of voltage bins that exhibit improved trigger metric values at the predetermined periods of time, as explained in more details herein. The selected subset of voltage bins can be designated as the placed voltage bins and can be associated with the memory device. Block families of the memory device can then be assigned to the placed voltage bins of the memory device, based on the time after program (TAP) of each block family, along with other factors, as explained in more details herein below.

In one implementation, bin placement management component 113 can, during an initial period of time, select a bin from the set of initial voltage bins and can perform a read operation of a block of the memory device using the read level offsets of the selected bin. Bin placement management component 113 can then determine a trigger metric associated with the read level offsets of the selected bin, based on the read operation. Read operation can be done for a representative/selected page type or for all page types. After determining the trigger metric associated with the selected bin, bin placement management component 113 determines whether the read level offsets of the selected bin resulted in an acceptable trigger metric based on the read operation (e.g., by determining whether or not the trigger metric exceeds a trigger metric threshold).

If the trigger metric exceeds the trigger metric threshold, bin placement management component 113 can select another bin from the set of initial voltage bins, and can perform another read operation using the read level offsets of the new bin to determine a trigger metric associated with the new bin. In an implementation, bin placement management component 113 can continue to select a new bin of the initial set of bins, perform a read operation, and determine trigger metric until a trigger metric that does not exceed the trigger metric threshold is determined. Bin placement management component 113 can then associate the new bin corresponding to the determined trigger metric with a particular SCL region and can include the new bin and the associated period of time in the set of placed voltage bins of the memory device. A SCL region is a range of SCL values for each read level offset associated with the bin. Since SCL can change for a particular memory page based on changes in temperature, time after program, and/or program erase cycles, placed bins can provide more accurate read level offsets when associated with SCL regions, each representing a different valley.

During the next period of time of the predetermined periods of time, bin placement management component 113 can perform a read operation using the read levels offsets of the previously selected bin to determine a trigger metric associated with the bin based on the read operation. If the trigger metric does not exceed the trigger metric threshold, bin placement management component 113 can determine that the previously selected bin has acceptable read level offsets at the next period of time and no further action is required. Alternatively, if the trigger metric exceeds the trigger metric threshold, bin placement management component 113 can select another bin from the set of initial voltage bins, and can perform another read operation using the read level offsets of the newly selected bin to determine a trigger metric associated with the new bin. In an implementation, bin placement management component 113 can continue to select a new bin of the initial set of bins, perform a read operation, and determine trigger metric until a trigger metric that does not exceed the trigger metric threshold is determined.

In certain embodiments, bin placement management component 113 can perform at least one read operation at each period of time of the predetermined periods of time in order to generate a set of placed voltage bins covering different SCL regions. The set of placed bins can then be associated with the memory device.

In certain implementations, bin placement management component 113 can determine that the number of placed bins exceeds a target number of placed bins for the memory device. Subsequently, bin placement management component 113 can modify the trigger metric threshold and repeat the bin placement process described above (e.g., by performing read operations at the predetermined periods of time and assigning voltage bins to the set of placed bins based on trigger metric values). As an example, if the number of placed bins is greater than the target number of bins, bin placement management component 113 can modify the trigger metric threshold to be less stringent than the existing trigger metric threshold and then repeat the bin placement process. In this case, a less stringent trigger metric threshold can result in a fewer number of placed bins because each bin can be valid for more periods of time, compared to a placed bin with a more stringent trigger metric threshold. Similarly, if the number of placed bins is less than the target number of bins, bin placement management component 113 can modify the trigger metric threshold to be more stringent than the existing trigger metric threshold and then repeat the bin placement process. A more stringent trigger metric threshold can result in a greater number of placed bins because each bin can be valid for fewer periods of time, compared to a placed bin with a less stringent trigger metric threshold. Higher number of bins result in finer granularity bins which results in lower RBER whereas lower number of bins result in coarser granularity bins which results in relatively higher RBER.

In one implementation, when selecting a new bin that satisfies the trigger metric threshold, bin placement management component 113 can detect that multiple bins of the set of initial voltage bins have read level offsets that can satisfy the trigger metric threshold. In this case, bin placement management component 113 can select a bin from the multiple bins that has the largest read level offset (in magnitude), such that the selected bin can be valid for as many periods of time as possible. On the other hand, if bin placement management component 113, during a given period of time, determines that no new bin from the set of initial bins can result in an improved trigger metric (e.g., a trigger metric that is farther away from the trigger metric threshold than the current trigger metric), bin placement management component 113 can determine that the bin placement process is complete. Bin placement management component 113 can determine that the bins currently included in the placed voltage bins are the full set of placed bins and can associate the set of placed voltage bins with the memory device.

FIG. 2 illustrates the temporal voltage shift caused at least in part by the slow charge loss exhibited by triple-level memory cells, in accordance with embodiments of the disclosure. While the illustrative example of FIG. 2 utilizes triple-level cells, the same observations can be made and, accordingly, the same remedial measures are applicable to single level cells and any memory cells having multiple levels.

A memory cell can be programmed (written to) by applying a certain voltage (e.g. program voltage) to the memory cell, which results in an electric charge stored by the memory cell. Precisely controlling the amount of the electric charge stored by the memory cell allows a memory cell to have multiple threshold voltage levels that correspond to different logical levels, thus effectively allowing a single memory cell to store multiple bits of information. A memory cell operated with $2^n$ different threshold voltage levels is capable of storing n bits of information.

Each of chart 210 and 230 illustrate program voltage distributions 220A-420N (also referred to as "program distributions" or "voltage distributions" or "distributions" or "levels" herein) of memory cells programmed by a respective write level (which can be assumed to be at the midpoint of the program distribution) to encode a corresponding logical level. The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The read threshold voltage levels are labeled Va-Vh. As shown, any measured voltage below Va is associated with the ER state. The states labeled P1, P2, P3, P4, P5, P6, and P7 correspond to distributions 22A-220N, respectively.

Time After Program (TAP) herein shall refer to the time since a cell has been written and is the primary driver of TVS (temporal voltage shift). TVS captures SCL as well as other charge loss mechanisms. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from X to Y minutes or hours after program). A time slice can be referenced by its center point.

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages are adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the read threshold voltage offsets used to read the memory cells for the dice of the die group are updated and are applied to the base read threshold levels to perform read operations.

Figure 3:
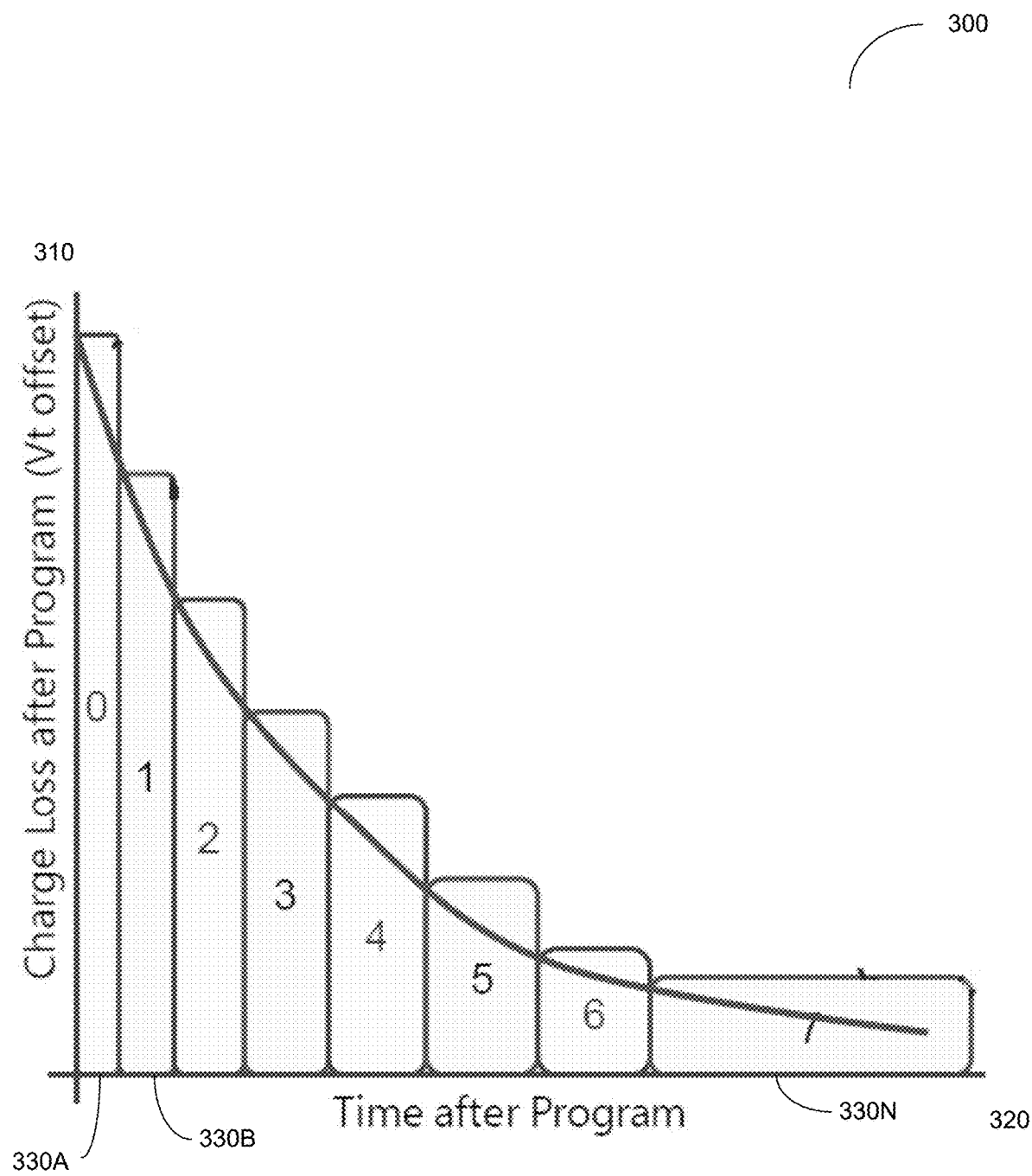
FIG. 3 depicts an example graph illustrating the dependency of the threshold voltage offset on the time after program (i.e., the period of time elapsed since the block had been programmed, in accordance with some embodiments of the present disclosure.

FIG. 3 depicts an example graph 300 illustrating the dependency of the threshold voltage offset 310 on the time after program 320 (i.e., the period of time elapsed since the block had been programmed. As schematically illustrated by FIG. 3, blocks of the memory device are grouped into block families 330A-330N, such that each block family includes one or more blocks that have been programmed within a specified time window and a specified temperature window. As noted herein above, given that wear-leveling can keep program/erase cycles similar on all blocks, the time elapsed after programming and temperature are the main factors affecting the temporal voltage shift. Accordingly, all blocks and/or partitions within block family 310 are presumed to exhibit similar distributions of threshold voltages in memory cells, and thus would require the same voltage offsets to be applied to the base read levels for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a foreground or background calibration process in order to associate each die of every block family with one of the predefines threshold voltage bins (bins 0-7 in the illustrative example of FIG. 3), which is in turn associated with the voltage offsets to be applied for read operations. The associations of blocks with block families and block families and dies with threshold voltage bins can be stored in respective metadata tables maintained by the memory sub-system controller.

Figure 4:
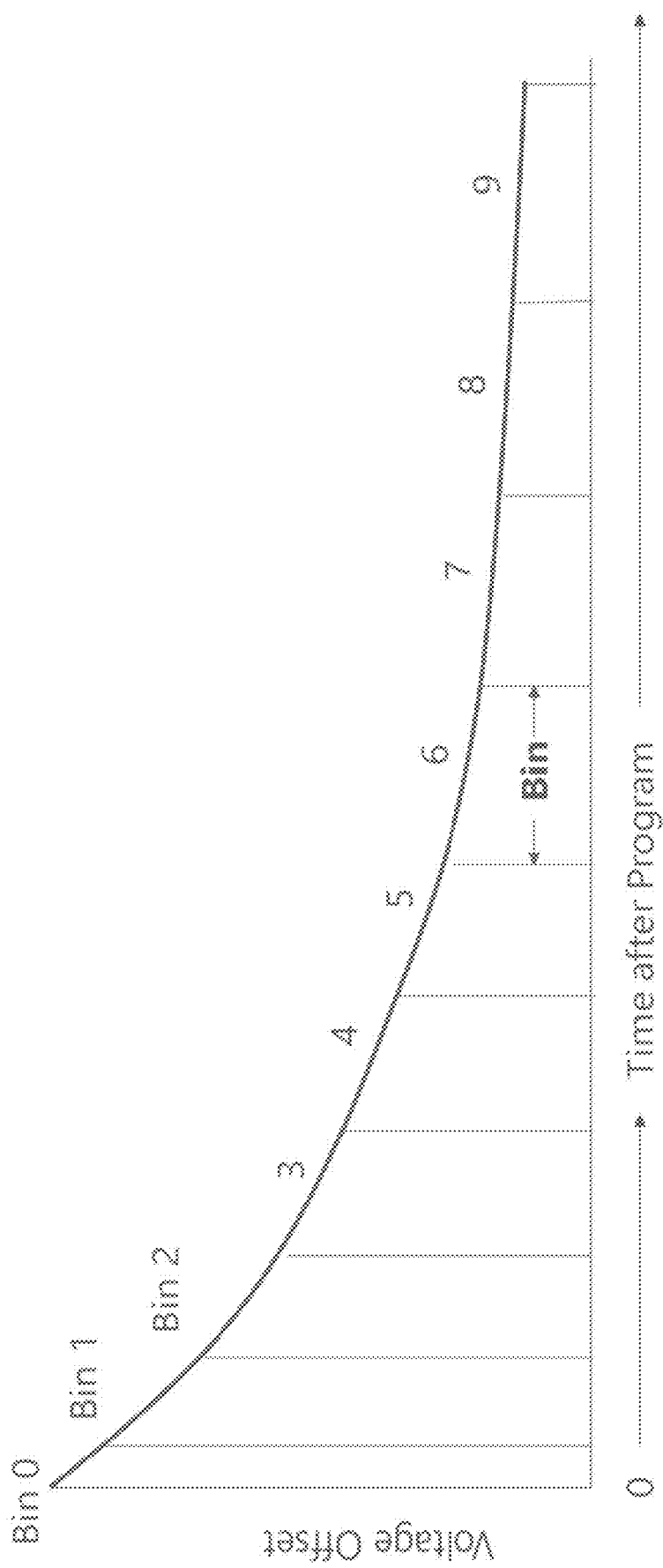
FIG. 4 schematically illustrates a set of predefined threshold voltage bins, in accordance with embodiments of the present disclosure.

FIG. 4 schematically illustrates a set of placed threshold voltage bins (bin 0 to bin 9), in accordance with embodiments of the present disclosure for a selected valley. In an implementation, the set of placed bins can be determined based on the bin placement process described in FIG. 8. As schematically illustrated by FIG. 4, the threshold voltage offset graph can be subdivided into multiple threshold voltage bins, such that each bin corresponds to a predetermined range of threshold voltage offsets. While the illustrative example of FIG. 4 defines ten bins, in other implementations, various other numbers of bins can be employed (e.g., 64 bins). Based on a periodically performed calibration process, the memory sub-system controller associates each die of every block family with a threshold voltage bin, which defines a set of threshold voltage offsets to be applied to the base voltage read level in order to perform read operations, as described in more detail herein below.

Figure 5:
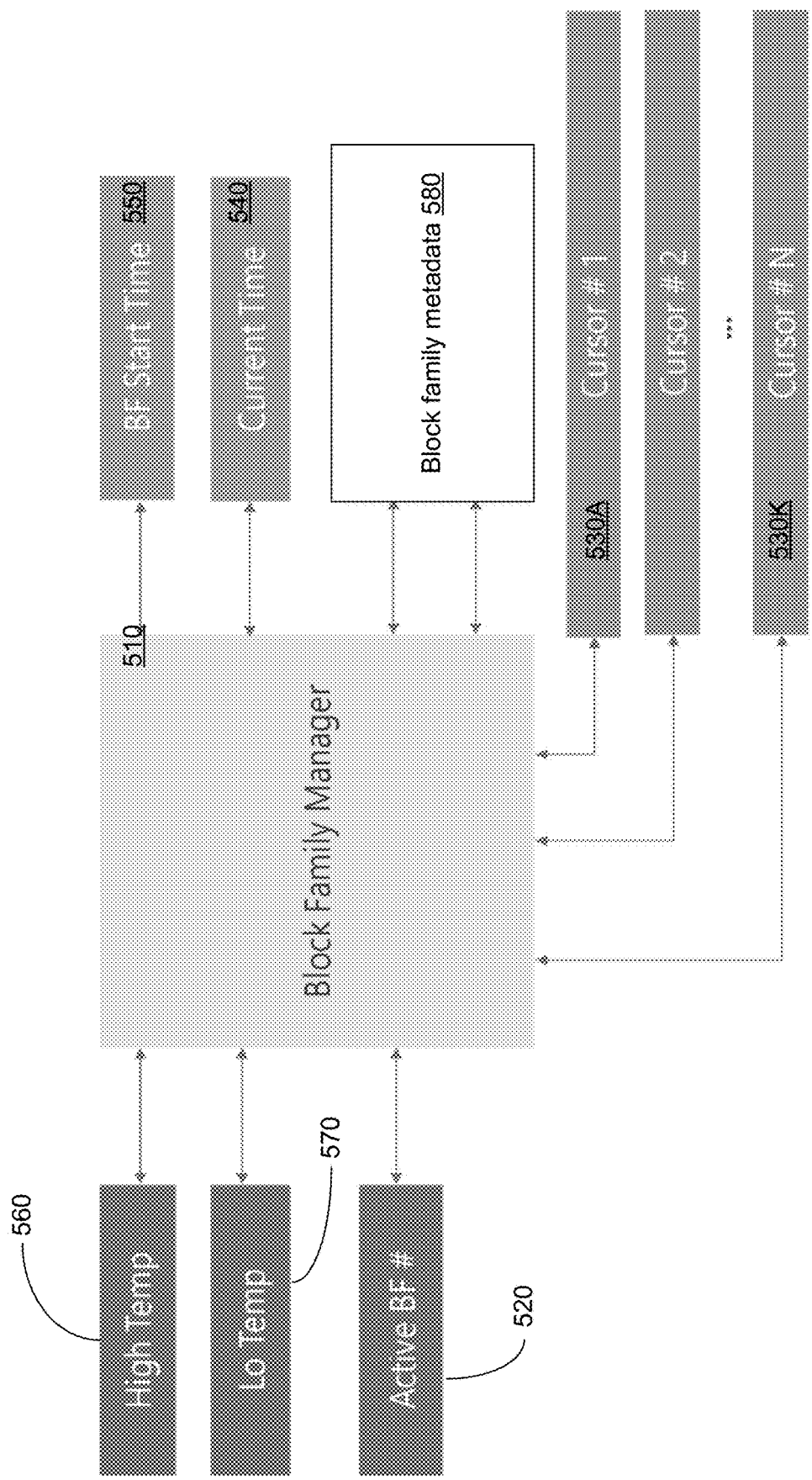
FIG. 5 schematically illustrates block family management operations implemented by the block family manager component of the memory-sub-system controller operating in accordance with embodiments of the present disclosure.

FIG. 5 schematically illustrates block family management operations implemented by the block family manager component of the memory-sub-system controller operating in accordance with embodiments of the present disclosure. As schematically illustrated by FIG. 5, the block family manager 510 can maintain, in a memory variable, an identifier 520 of the active block family, which is associated with one or more blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, the current time 540 is stored in a memory variable as the block family start time 550. As the blocks are programmed, the current time 540 is compared to the block family start time 550. Responsive to detecting that the difference of the current time 540 and the block family start time 550 is greater than or equal to the specified time period (e.g., a predetermined number of minutes), the memory variable storing the active block family identifier 520 is updated to store the next block family number (e.g., the next sequential integer number), and the memory variable storing the block family start time 550 is updated to store the current time 540.

The block family manager 510 can also maintain two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager 510 can further periodically compute the difference between the high temperature 560 and the low temperature 570. Responsive to determining that the difference between the high temperature 560 and the low temperature 570 is greater than or equal to a specified temperature threshold, the block family manager 510 can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device.

At the time of programming a block, the memory sub-system controller associates the block with the currently active block family. The association of each block with a corresponding block family is reflected by the block family metadata 580, as described in more detail herein below with reference to FIG. 7.

As noted herein above, based on a periodically performed calibration process, the memory sub-system controller associates each die of every block family with a threshold voltage bin, which defines a set of threshold voltage offsets to be applied to the base voltage read level in order to perform read operations. The calibration process involves performing, with respect to a specified number of selected blocks within the block family that is being calibrated, read operations utilizing different threshold voltage offsets (i.e., bin offsets), and choosing the bin that minimizes the error rate of the read operation. The block within the block family can be randomly selected, or selected based on satisfying a specific criterion (such as being oldest in the block family).

Figure 6:
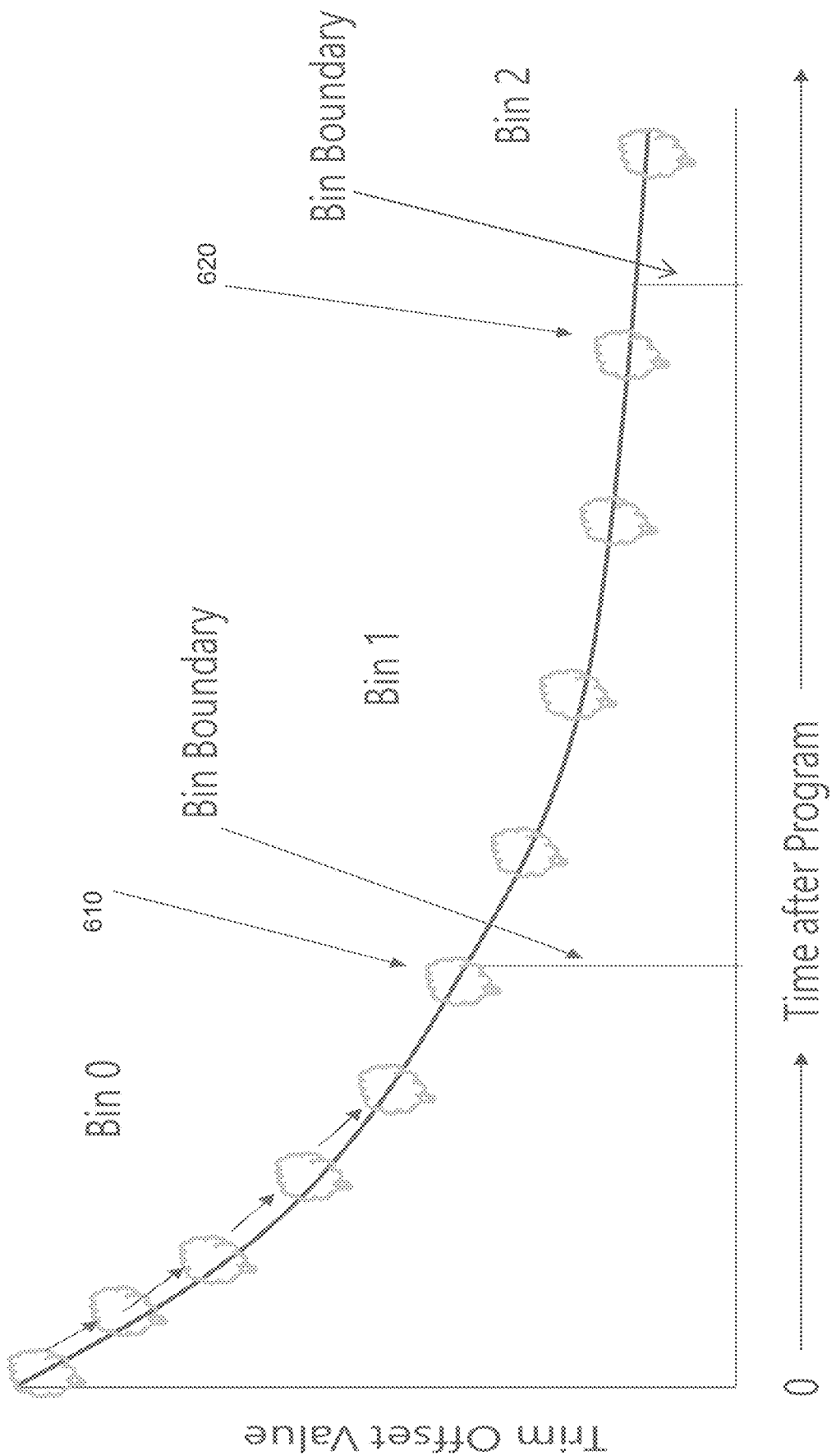
FIG. 6 schematically illustrates selecting block families for calibration, in accordance with embodiments of the present disclosure.

FIG. 6 schematically illustrates selecting block families for calibration, in accordance with embodiments of the present disclosure. As schematically illustrated by FIG. 6, the memory sub-system controller can limit the calibration operations to the oldest block family in each bin (e.g., block family 610 in bin 0 and block family 620 in bin 1), since it is the oldest block family that will, due to the slow charge loss, migrate to the next bin before any other block family of the current bin.

FIG. 7 schematically illustrates example metadata maintained by the memory sub-system controller for associating blocks and/or partitions with block families, in accordance with embodiments of the present disclosure. As schematically illustrated by FIG. 7, the memory sub-system controller can maintain the superblock table 710, the family table 720, and the offset table 730.

Each record of the superblock table 710 specifies the block family associated with the specified superblock and partition combination. In some implementations, the superblock table records can further include time and temperature values associated with the specified superblock and partition combination.

The family table 720 is indexed by the block family number, such that each record of the family table 720 specifies, for the block family referenced by the index of the record, a set of threshold voltage bins associated with respective dies of the block family. In other words, each record of the family table 720 includes a vector, each element of which specifies the threshold voltage bin associated with the die referenced by the index of the vector element. The threshold voltage bins to be associated with the block family dies can be determined by the calibration process, as described in more detail herein above.

Finally, the offset table 730 is indexed by the bin number. Each record of the offset table 730 specifies a set of threshold voltage offsets (e.g., for TLC, MLC, and/or SLC) associated with threshold voltage bin.

When combining two block families, e.g., by merging the blocks of a first block family into a second block family, then deleting the first block family, the metadata tables 710-730 can be updated as a result of combining the two block families. For example, that superblock table 710 can be updated to reflect that superblock and partition combinations of the first block family should be associated with the second block family. Similarly, the family table 720 can be updated to delete a record associated with the first block family from family table 720.

The metadata tables 710-730 can be stored on one or more memory devices 130 of FIG. 1. In some implementations, at least part of the metadata tables can be cached in the local memory 119 of the memory sub-system controller 115 of FIG. 1.

In operation, upon receiving a read command, the memory sub-system controller determines the physical address corresponding to the logical block address (LBA) specified by the read command. Components of the physical address, such as the physical block number and the die identifier, are utilized for performing the metadata table walk: first, the superblock table 710 is used to identify the block family identifier corresponding to the physical block number; then, the block family identifier is used as the index to the family table 720 in order to determine the threshold voltage bin associated with the block family and the die; finally, the identified threshold voltage bin is used as the index to the offset table 730 in order to determine the threshold voltage offset corresponding to the bin. The memory sub-system controller can then additively apply the identified threshold voltage offset to the base voltage read level in order to perform the requested read operation.

In the illustrative example of FIG. 7, the superblock table 710 maps partition 0 of the superblock 0 to block family 4, which is utilized as the index to the family table 720 in order to determine that die 0 is mapped to bin 3. The latter value is used as the index to the offset table in order to determine the threshold voltage offset values for bin 3.

Figure 8:
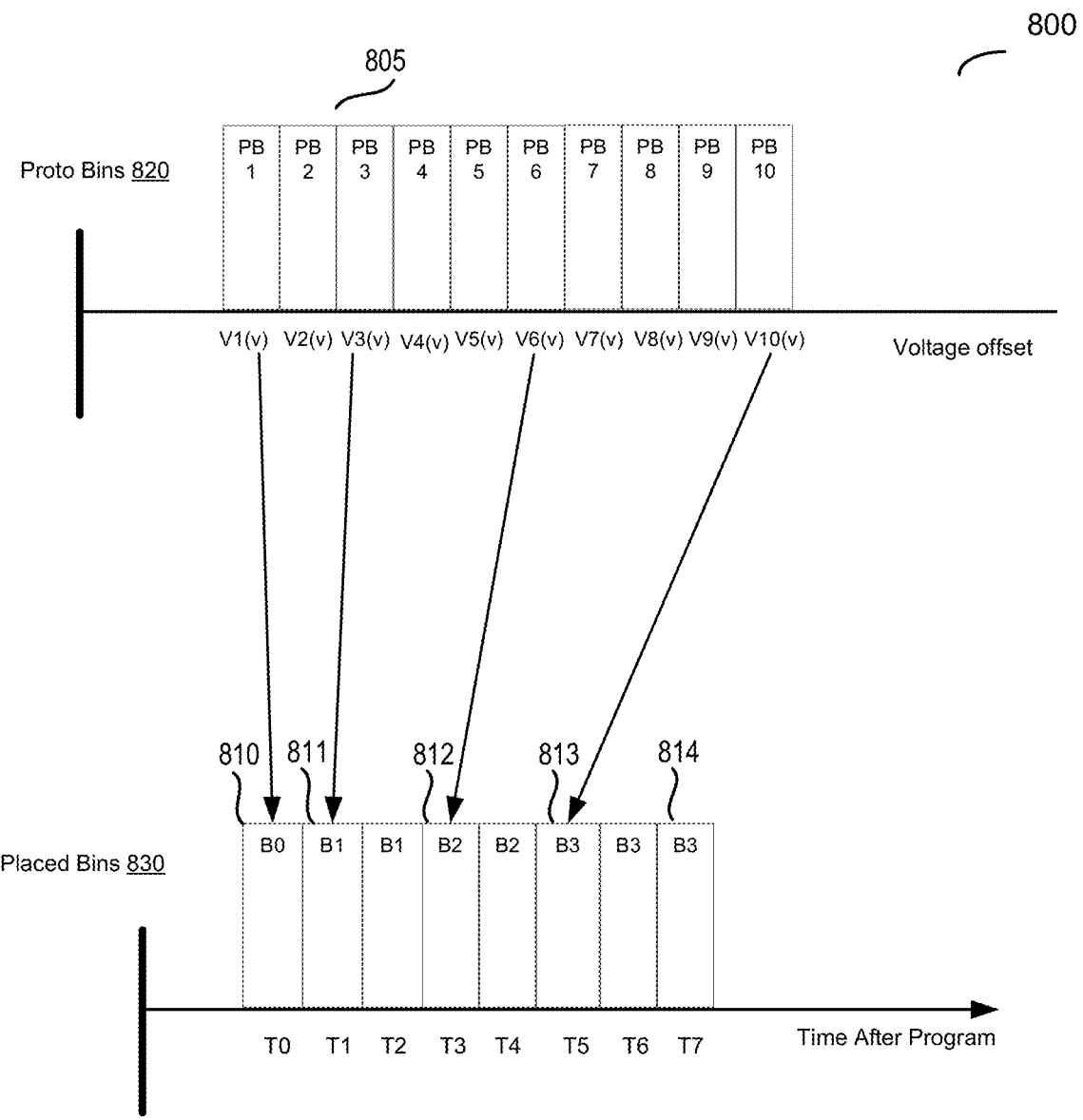
FIG. 8 depicts a sequence diagram illustrating the flow of events for an example method of generating a set of placed bins by selecting bins from an initial set of proto bins based on trigger metric values, in accordance with one or more aspects of the present disclosure.

FIG. 8 depicts a sequence diagram illustrating the flow of events for an example method 800 of generating a set of placed bins by selecting bins from an initial set of proto bins based on trigger metric values, in accordance with one or more aspects of the present disclosure. Method 800 may be performed by processing logic that includes hardware (e.g., circuitry, dedicated logic, programmable logic, microcode, etc.), software (e.g., instructions run on a processor to perform hardware simulation), or a combination thereof. In some embodiments, the method 800 is performed by bin placement management component 113 of FIG. 1.

Method 800 starts at operation 805. At operation 805, the processing logic generates an initial set of bins, proto bins 820 that includes proto bins PB 1-PB 10. Each proto bin is associated with corresponding read level offsets $V1(v)$-$V10(v)$ where v is index for the valleys, which can be used for read operations of blocks associated with the proto bin based on a page type, as explained in more details above. For TLC, there can be 7 valleys and hence each proto bin will have 7 offsets one for each valley such as TLC1-TLC7 in offset table 730 of FIG. 7. In 805 $V1(v)$-$V10(v)$ are each a vector of 7 values for a TLC system. In an implementation, proto bins 820 can be generated such the read level offsets for a representative valley $V1(v)$-$V10(v)$ are equally spaced within the voltage distribution of threshold voltages. As an example, each read level offset of $V1(v)$-$V10(v)$ is 2 DACs apart from the adjacent read level offset for the representative valley. The representative valley can be selected to have the highest SCL signal which is usually the valley between two levels that have highest threshold voltages such as rightmost two voltage distributions in FIG. 2.

At operation 810 the processing logic at time T0 starts selecting bins from proto bins 820 to populate the set of placed bins 830 over a set of predetermined time slices T0-T7. Time slices T0-T7 refer to consecutive periods of time elapsed after programming a block of memory. As an example, each time slice of T0-T7 can correspond to different time intervals in log time such as 1 minutes, 10 minutes, 100 minutes, 1000 minutes etc. During T0, the processing logic can select PB1 from proto bins 820 as the initial placed bin B0. In an implementation, the processing logic can perform a read operation of a block of memory using read offsets of PB1 and can determine a trigger metric based on the read operation. In an illustrative example, the trigger metric can be a trigger rate representing a percentage of memory cells of the memory device with high error rate, based on the results of the read operation of the block of memory. The processing logic can then compare the trigger metric to a trigger metric threshold. If the trigger metric does not exceed the trigger metric threshold, the processing logic can designate PB1 as B0 of placed bins 830 and can further associate B0 with T0 in the placed bins 830. In an implementation, placed bins 830 can be a data structure that can store associations between bins and corresponding periods of time (e.g., time slices T0-T7).

At operation 811, the processing logic, during a next time slice T1, can perform another read operation of the block of memory using $V1(v)$ of B0 (the most recently placed bin), and can determine a trigger metric based on the read operation, in order to determine if $V1(v)$ are valid read level offsets during T1. The processing logic can determine whether the trigger metric exceeds the trigger metric threshold. Upon determining that the trigger metric associated with V1 exceeds the trigger metric threshold, the processing logic selects another bin PB3 from proto bins 820 as the placed bin B1 during time slice T1. In an implementation, the processing logic can select PB3 responsive to performing a second read operation of the block of memory using $V3(v)$ of PB3 and determining that a trigger metric based on the second read operation does not exceed the trigger metric threshold. Accordingly, the processing logic designate PB3 as B1 of placed bins 830 and can further associate B1 with T1 in the placed bins 830.

During time slice T2, the processing logic can perform another read operation of the block of memory using $V3(v)$ of B1 (the most recently placed bin), and can determine a trigger metric based on the read operation, in order to determine if $V3(v)$ of B1 are valid read level offsets during T2. The processing logic can then determine whether the trigger metric exceeds the trigger metric threshold. Upon determining that the trigger metric does not exceed the trigger metric threshold, the processing logic can determine that read offsets of B1 are valid read level offsets at T2. The processing logic can wait until the next time slice to perform another read operation using V3 of B1.

Similar to operation 811, at operation 812 the processing logic, during time slice T3, can perform a read operation of the block of memory using $V3(v)$ of bin B1 (the most recently placed bin), and can determine a trigger metric based on the read operation. The processing logic can determine whether the trigger metric exceeds the trigger metric threshold. Upon determining that the trigger metric associated with V3 exceeds the trigger metric threshold, the processing logic selects another bin PB6 from proto bins 820 as the placed bin B2 during time slice T3. In an implementation, the processing logic can select PB6 responsive to performing a second read operation of the block of memory using $V6(v)$ of PB6 and determining that a trigger metric based on the second read operation does not exceed the trigger metric threshold. Accordingly, the processing logic designate PB6 as B2 of placed bins 830 and can further associate B2 with T3 in the placed bins 830.

During time slice T4, the processing logic can perform another read operation of the block of memory using $V6(v)$ of B2 (the most recently placed bin), and can determine a trigger metric based on the read operation, in order to determine if $V6(v)$ of B2 are valid read levels offset during T4. The processing logic can then determine whether the trigger metric exceeds the trigger metric threshold. Upon determining that the trigger metric does not exceed trigger metric threshold, the processing logic can determine that read offsets of B2 are valid read level offsets at T4. The processing logic can wait until the next time slice to perform another read operation using $V6(v)$ of B2.

Similar to operation 811 and operation 812, at operation 813 the processing logic, during time slice T5, can perform a read operation of the block of memory using $V6(v)$ bin B2, and can determine a trigger metric based on the read operation. Upon determining that the trigger metric associated with read offsets of B2 (read offsets of PB6) exceeds the trigger metric threshold, the processing logic selects another PB10 from proto bins 820 as the placed bin B3 during time slice T5. In an implementation, the processing logic can select PB10 responsive to performing a second read operation of the block of memory using V10(v) of PB10and determining that a trigger metric based on the second read operation does not exceed the trigger metric threshold. Accordingly, the processing logic designate PB10 as B3 of placed bins 830 and can further associate B3 with T5 in the placed bins 830.

During time slice T6, the processing logic can perform another read operation of the block of memory using V10(v) of B3, and can determine a trigger metric based on the read operation, in order to determine if read offsets if B3 (read offsets of PB10) are valid read level offsets during T6. The processing logic can then determine whether the trigger metric exceeds the trigger metric threshold. Upon determining that the trigger metric does not exceed the trigger metric threshold, the processing logic can determine that V10(v) of B3 are valid read level offset at T6. The processing logic can wait until the next time slice to perform another read operation using V10(v) of B3.

At operation 814, during time slice T7, the processing logic can perform a read operation of the block of memory using V10(v) of B3, and can determine a trigger metric based on the read operation, in order to determine if read offsets of B3 are valid read level offsets during T7. The processing logic can then determine whether the trigger metric exceeds the trigger metric threshold. Upon determining that the trigger metric exceeds the trigger metric threshold, the processing logic attempts to find another proto bin of proto bins 820 that has read level offsets that can result in a trigger metric that does not exceed the trigger metric threshold. In another example, the processing logic can attempt to find another proto bin of proto bins 820 with read level offsets that can result in a trigger metric that is better than the trigger metric associated with read offsets of B3 (e.g., a trigger metric that exceeds the threshold with a smaller margin). At 814, the processing logic fails to find a proto bin of the proto bins 820 that can result in a better trigger metric than the trigger metric associated with B3. In this case, the processing logic can determine that the bin placement process is complete, and can stop performing further read operations at subsequent time slices. The processing logic can further associate placed bins 830, containing bins B0-B3 with the memory device.

Figure 9:
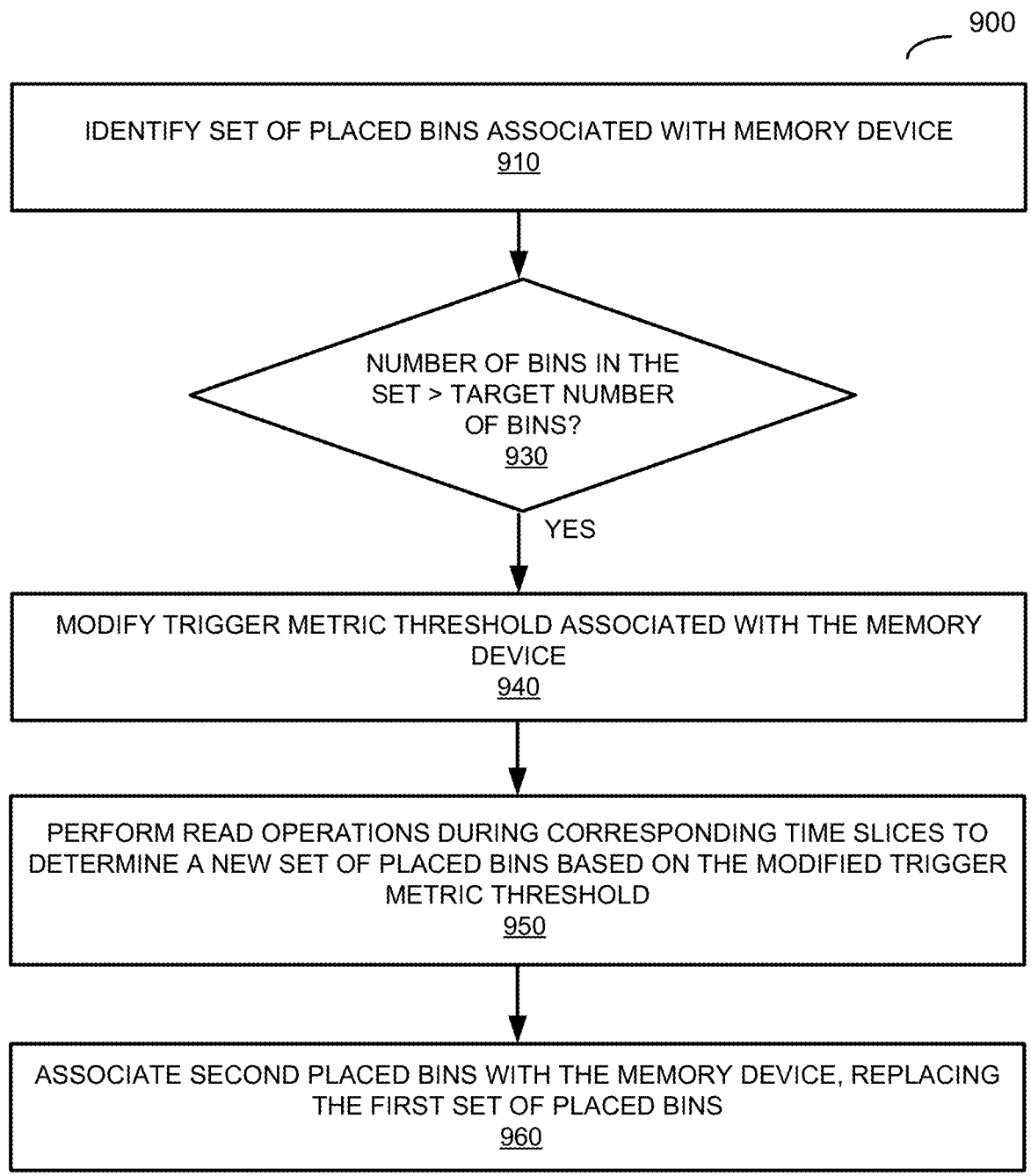
FIG. 9 is a flow diagram of an example method of changing the number of bins in a set of placed bins, to match a target number of placed bins, by modifying a trigger metric threshold of a memory device in accordance with some embodiments of the present disclosure.

FIG. 9 is a flow diagram of an example method of changing the number of bins in a set of placed bins, to match a target number of placed bins, by modifying a trigger metric threshold of a memory device in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the bin placement management component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 910, the processing logic identifies a set of placed bins that is associated with a memory device. In implementations, the set of placed bins can be used by block families of the memory device, such that a block family that is assigned to a placed bin can perform read operations of blocks based on the read level offsets of the assigned placed bin. In this case, a block family can be assigned to a placed bin based on the TAP associated with the block family, as explained in more details above.

At operation 930, the processing logic determine whether the number of bins in the set of placed bins is greater than a target number of bins. In certain implementations, the processing logic can accept a number of placed bins that are greater than the target number of bins and can adjust the calibration process of read level voltages of the memory device accordingly. In other implementations, the processing logic can determine to modify a trigger metric threshold that is used during the process of generating the set of placed bins, such that the number of placed bins can be changed, as explained below.

At operation 940, the processing logic determines that the number of bins in the set of placed bins is greater than the target number of bins. The processing logic can then modify the trigger metric threshold that is associated with the memory device and then repeating the bin placement generation process, such that the number of placed bins are smaller than the current number of placed bins. In an implementation, when the number of placed bins is greater than the target number of bins, the trigger metric threshold can be modified to be less stringent than the current trigger metric threshold. In this case, a less stringent trigger metric threshold can result in a fewer number of placed bins because each bin can be valid for more time slices, compared to a placed bin with a more stringent trigger metric threshold. Similarly, if the number of bins in the set of placed bins is less than the target number of bins, the trigger metric threshold can be modified to be more stringent than the current trigger metric threshold. A more stringent trigger metric threshold can result in a greater number of placed bins because each bin can be valid for fewer time slices, compared to a placed bin with a less stringent trigger metric threshold.

At operation 950, after modifying the trigger metric threshold to be less stringent, the processing logic can repeat the bin placement process by performing read operations during corresponding time slices to determine a new set of placed bins based on the modified trigger metric threshold, and can determine the number of placed bins based on the modified trigger metric threshold. In an implementation, the processing logic can repeat the process of modifying the trigger metric threshold, repeating the placed bin selection process, and comparing the number of placed bins o the target number of placed bins until the difference between the target number of placed bins and the actual number of placed bins satisfies a certain threshold (e.g., exact match).

At operation 960, when the difference between the target number of placed bins and the actual number of placed bins satisfies the threshold, the processing logic can associate the generated placed bin with the memory device, replacing the original set of placed bins that was associated with the memory device.

FIG. 10 is a flow diagram of an example method of managing bin placement for block families of a memory device based on trigger metric values associated with placed bins, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the bin placement management component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1010, the processing logic starts the process of selecting placed bins from an initial set of bins. The processing logic selects, during a first period of time from a set of predetermined periods of time, a first bin of an initial set of voltage bins that are associated with a memory device. Each bin of the initial set of voltage bins is associated with corresponding read level offsets, one read level offset per valley. In implementations, the read level offsets of the initial set of voltage bins per valley can be equally spaced within the voltage space of threshold voltages, and the initial set of bins can have more bins than a target number of placed bins, as explained in more details herein.

At operation 1020, the processing logic perform, during a second period of time, a read operation of a block of the memory device using read level offsets of the first bin. In one implementation, the read operation can be performed for a specific page type that is most sensitive to SCL. In another implementation, the read operation can be performed for all page types to use all read level offsets of a given bin. The processing logic performs the read operation using the read level offsets that is associated with the most recently placed bin. At operation 1040, in order to determine whether or not the first bin generates valid read results at the second period of time, the processing logic determine, based on the read operation, a trigger metric associated with the read level offsets of the first bin. For example, the trigger metric can be a trigger rate indicating the extent to which the memory device should go into error recovery due to non-correctable cells of the memory device, as explained in more details herein above.

At operation 1050, responsive to determining that the trigger metric that is based on the read operation fails to satisfy a predefined condition (e.g., exceeds a trigger metric threshold), the processing logic can select a second bin of the initial set of bins, such that a read level offsets of the second bin is associated with a trigger metric that satisfies the predefined condition (e.g., is below the trigger metric threshold). In an example, the processing logic can make this determination by performing a second read operation using the read level offsets of the second bin and determining that the trigger metric associated with the second read operation does not exceed the trigger metric threshold, as explained in more details herein above.

Figure 11:
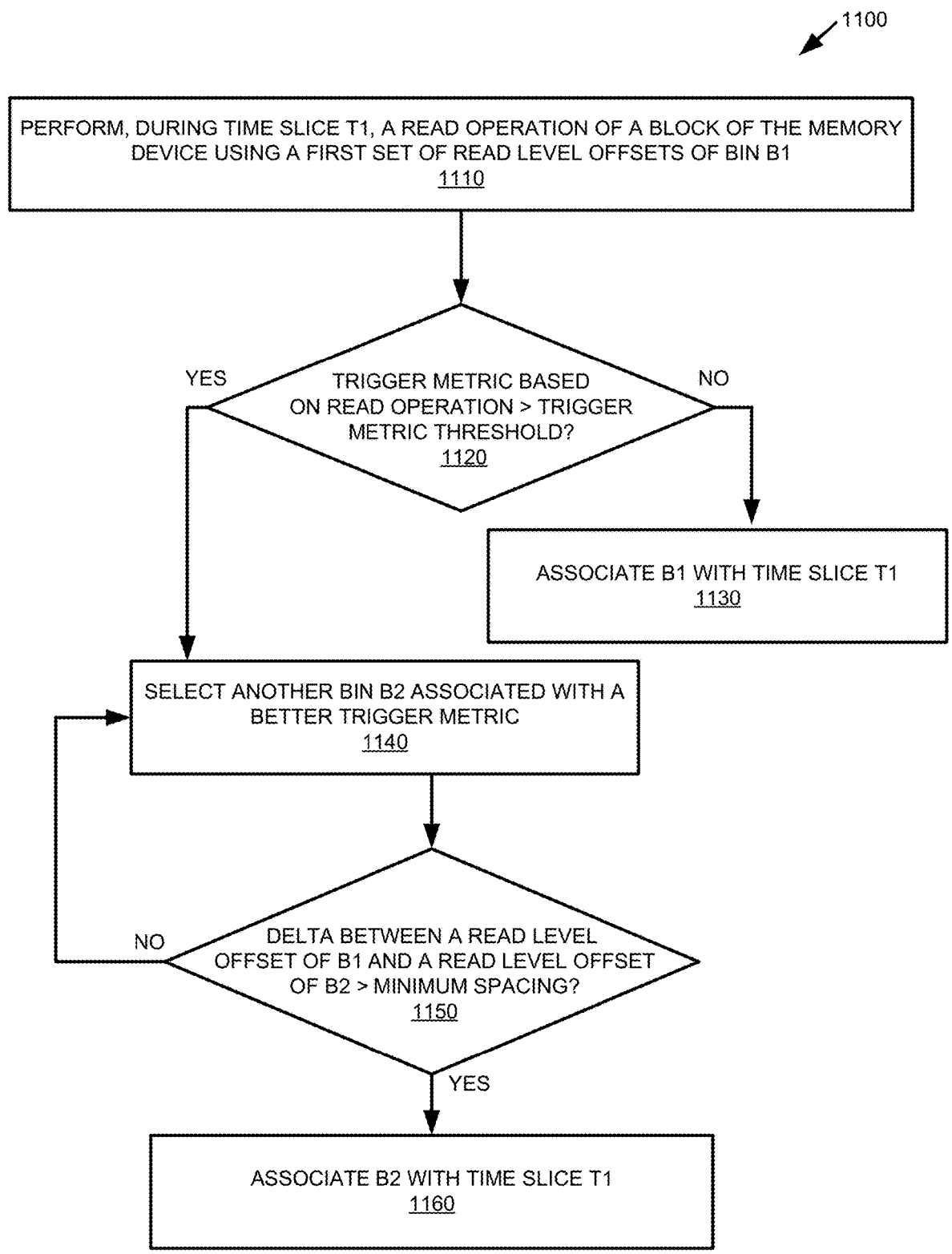
FIG. 11 is a flow diagram of an example method of selecting placed bins that satisfy a minimum bin spacing criterion between the read level offsets of adjacent bins, in accordance with some embodiments of the present disclosure.

FIG. 11 is a flow diagram of an example method of selecting placed bins that satisfy a minimum bin spacing criterion between the read level offsets of adjacent bins per valley, in accordance with some embodiments of the present disclosure. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the bin placement management component 113 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 1110, the processing logic, during a time slice T1 performs a read operation of a block of the memory device using a read level offsets of bin B1. In one implementation, B1 can be the most recently placed bin during a process of selecting a set of placed bins for the memory device. At operation 1120, the processing logic determines whether a trigger metric based on the read operation exceeds a trigger metric threshold, in order to determine whether B1 is a valid bin at time slice T1.

At operation 1130, when the processing logic determines that the trigger metric does not exceed the trigger metric threshold, the processing logic determines that the read level offsets of B1 are valid during time slice T1, and can associates B1 with time slice T1 in the set of placed bins.

At operation 1140, when the processing logic determines that the trigger metric that is based on the read operation exceeds the trigger metric threshold, indicating that the read level offsets of B1 is not valid during time slice T1, the processing logic can select another bin B2 from a set of initial voltage bins. In an implementation, B2 can be selected such that read level offsets associated with B2 can result in a trigger metric that is better than the trigger metric associated with B1 (e.g., the trigger metric of B2 does not exceed the trigger metric threshold).

At operation 1150, the processing logic can further determine whether a delta between the read level offsets of B1 and the read level offsets of B2 satisfies a minimum bin spacing condition per valley. As an example, the processing logic can determine that if the delta between the two read level offsets is less than 5 DACs for a given valley, then B1 and B2 can be considered too close to each other. The processing logic can then attempt to select another bin that satisfies the trigger metric as well as the bin spacing metric, by repeating operation 1140 to select a new bin as B2.

On the other hand, at operation 1160, when the processing logic determines that the delta between the read level offset of B1 and the read level offset of B2 for a given valley satisfies the minimum bin spacing condition (e.g., equal to or greater than 5 DACs), the processing logic can associate B2 to time slice T1. The processing logic can further add B2 to the set of placed bins that is associated with the memory device, as explained in more details herein above.

Figure 12:
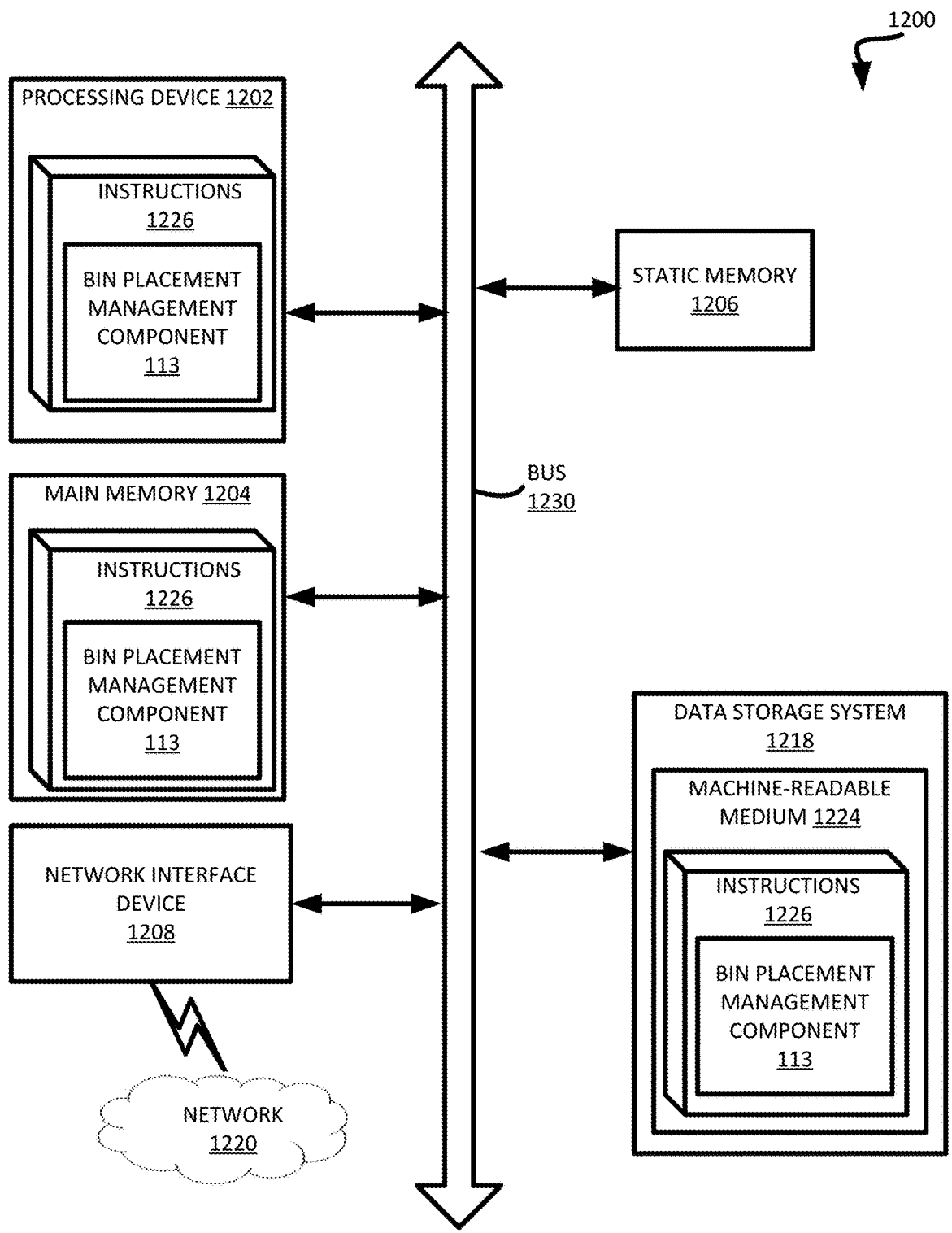
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to bin placement management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality corresponding to bin placement management component 113 of FIG. 1. While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

What is claimed is:

1. A method comprising:
   selecting, during a first period of time of a plurality of predetermined periods of time, a first voltage bin of a plurality of voltage bins associated with a memory device;
   performing, during a second period of time of the plurality of predetermined periods of time, a read operation of a block of the memory device, wherein the read operation is performed using a first set of read level offsets associated with the first voltage bin;
   determining, based on the read operation, a trigger metric associated with the first set of read level offsets associated with the first voltage bin;
   determining whether the trigger metric satisfies a predefined condition; and
   responsive to determining that the trigger metric satisfies the predefined condition, performing a second read operation, during a third period of time, using the first set of read level offsets associated with the first voltage bin.

2. The method of claim 1, wherein the trigger metric is a trigger rate representing a percentage of memory cells of the memory device having high error rates.

3. The method of claim 1 further comprising:
   responsive to determining that the trigger metric fails to satisfy the predefined condition, determining that the read operation was performed using an incorrect set of read level offsets corresponding to each valley.

4. The method of claim 1, further comprising:
   responsive to determining that the trigger metric fails to satisfy the predefined condition, selecting a second voltage bin of the plurality of voltage bins, wherein a second set of read level offsets associated with the second voltage bin is associated with a second trigger metric that satisfies the predefined condition.

5. The method of claim 4 further comprising:
   performing a third read operation of the block using the second set of read level offsets associated with the second voltage bin; and
   determining that a second trigger metric that is based on the third read operation satisfies the predefined condition.

6. The method of claim 4, wherein selecting the second voltage bin further comprises:
   responsive to determining that a subset of the plurality of voltage bins are associated with trigger metrics that satisfy the predefined condition, selecting, as the second voltage bin, a bin of the subset of the plurality of voltage bins, wherein the bin has a largest set of read level offsets among the subset of the plurality of voltage bins for a representative level.

7. The method of claim 4 further comprising:
   associating the first voltage bin with a first slow charge loss (SCL) region;
   associating the second voltage bin with a second SCL region; and
   assigning the first voltage bin and the second voltage bin to a set of placed bins associated with the memory device.

8. The method of claim 7 further comprising:
   determining whether a number of bins in the set of placed bins matches a target number of placed bins; and
   responsive to determining that the number of bins in the set of placed bins does not match the target number of placed bins:
      determining a trigger metric threshold associated with the predefined condition;
      modifying the trigger metric threshold;
      performing a plurality of read operations at a corresponding plurality of periods of time to determine a second set of placed bins based on the modified trigger metric threshold; and
      associating the second set of placed bins with the memory device.

9. A system comprising:
   a memory device; and
   a processing device, operatively coupled to the memory device, the processing device to perform operations comprising:
   selecting, during a first period of time of a plurality of predetermined periods of time, a first voltage bin of a plurality of voltage bins associated with a memory device;
   performing, during a second period of time of the plurality of predetermined periods of time, a read operation of a block of the memory device, wherein the read operation is performed using a first set of read level offsets associated with the first voltage bin;
   determining, based on the read operation, a trigger metric associated with the first set of read level offsets associated with the first voltage bin;
   determining whether the trigger metric satisfies a predefined condition; and
   responsive to determining that the trigger metric satisfies the predefined condition, performing a second read operation, during a third period of time, using the first set of read level offsets associated with the first voltage bin.

10. The system of claim 9, wherein the trigger metric is a trigger rate representing a percentage of memory cells of the memory device having high error rates.

11. The system of claim 9, the operations further comprising:
    responsive to determining that the trigger metric fails to satisfy the predefined condition, determining that the read operation was performed using an incorrect set of read level offsets corresponding to each valley.

12. The system of claim 9, the operations further comprising:
    responsive to determining that the trigger metric fails to satisfy the predefined condition, selecting a second voltage bin of the plurality of voltage bins, wherein a second set of read level offsets associated with the second voltage bin is associated with a second trigger metric that satisfies the predefined condition.

13. The system of claim 12, the operations further comprising:
    performing a third read operation of the block using the second set of read level offsets associated with the second voltage bin; and
    determining that a second trigger metric that is based on the third read operation satisfies the predefined condition.

14. The system of claim 13, the operations further comprising:
associating the first voltage bin with a first slow charge loss (SCL) region;
associating the second voltage bin with a second SCL region; and
assigning the first voltage bin and the second voltage bin to a set of placed bins associated with the memory device.

15. The system of claim 14, the operations further comprising:
determining whether a number of bins in the set of placed bins matches a target number of placed bins; and
responsive to determining that the number of bins in the set of placed bins does not match the target number of placed bins:
determining a trigger metric threshold associated with the predefined condition;
modifying the trigger metric threshold;
performing a plurality of read operations at a corresponding plurality of periods of time to determine a second set of placed bins based on the modified trigger metric threshold; and
associating the second set of placed bins with the memory device.

16. The system of claim 12, wherein selecting the second voltage bin further comprises:
responsive to determining that a subset of the plurality of voltage bins are associated with trigger metrics that satisfy the predefined condition, selecting, as the second voltage bin, a bin of the subset of the plurality of voltage bins, wherein the bin has a largest set of read level offsets among the subset of the plurality of voltage bins for a representative level.

17. A non-transitory computer-readable storage medium comprising instructions that, when executed by a processing device, cause the processing device to perform operations comprising:
selecting, during a first period of time of a plurality of predetermined periods of time, a first voltage bin of a plurality of voltage bins associated with a memory device;
performing, during a second period of time of the plurality of predetermined periods of time, a read operation of a block of the memory device, wherein the read operation is performed using a first set of read level offsets associated with the first voltage bin;
determining, based on the read operation, a trigger metric associated with the first set of read level offsets associated with the first voltage bin;
determining whether the trigger metric satisfies a predefined condition; and
responsive to determining that the trigger metric satisfies the predefined condition, performing a second read operation, during a third period of time, using the first set of read level offsets associated with the first voltage bin.

18. The non-transitory computer-readable storage medium of claim 17, wherein the trigger metric is a trigger rate representing a percentage of memory cells of the memory device having high error rates.

* * * * *